United States Patent [19]
Klem

[11] Patent Number: 4,813,732
[45] Date of Patent: Mar. 21, 1989

[54] APPARATUS AND METHOD FOR AUTOMATED WAFER HANDLING

[75] Inventor: David C. Klem, Mesa, Ariz.

[73] Assignee: Epsilon Technology, Inc., Tempe, Ariz.

[21] Appl. No.: 37,098

[22] Filed: Apr. 9, 1987

Related U.S. Application Data

[63] Continuation of Ser. No. 709,518, Mar. 7, 1985, abandoned.

[51] Int. Cl.[4] .............................................. B25J 15/10
[52] U.S. Cl. ................................ 294/103.1; 294/907; 901/30
[58] Field of Search ............... 414/730, 732, 736, 740, 414/741, 744 A, 749, 751, 786; 901/39, 49, 34, 30; 294/907, 103.1

[56] References Cited

U.S. PATENT DOCUMENTS

| | | | |
|---|---|---|---|
| 3,251,483 | 5/1966 | Devol | 901/49 X |
| 3,682,327 | 8/1972 | Winne | 414/744 A |
| 3,874,525 | 4/1975 | Hassan et al. | 901/39 X |
| 3,948,093 | 4/1976 | Folchi et al. | 901/34 X |
| 4,066,178 | 1/1978 | Carson | 414/740 X |
| 4,132,318 | 1/1979 | Wang et al. | 901/34 X |
| 4,484,855 | 11/1984 | Inaba et al. | 294/103.1 X |
| 4,492,512 | 1/1985 | Mink | 414/744 A |
| 4,627,785 | 12/1986 | Monforte | 294/907 X |
| 4,639,028 | 1/1987 | Olson | 294/103.1 X |

*Primary Examiner*—Frank E. Werner
*Assistant Examiner*—David A. Bucci
*Attorney, Agent, or Firm*—Harry M. Weiss

[57] ABSTRACT

In order to manipulate semiconductor wafers with high functional reliability, a tactile sensor based wafer handling apparatus designed to attach to a commercially available industrial robotic arm is herein described. The apparatus has three rod-like projections called fingers, one finger of which is extendable, the other which are fixed. All fingers are instrumented with strain gauge sensors in order to allow the monitoring of all forces applied to the fingers during wafer handling operations. All sensors provide proportional data. The wafer handling apparatus enables a monitoring computer to direct the motions of a satisfactorily equipped robot arm to operate in the following modes of operation. Force controlled grasping of the wafer can be provided to insure adequate grasp for transport and to limit forces exerted on the wafer. Force monitoring while releasing a wafer can be provided to insure safe hand off to another device or surface thus minimizing the likelihood of dropping a wafer. Proportional adaptive control of robot motions necessary can be provided to align wafers extremely closely to process carrier surfaces. Proportional adaptive control of robot motions necessary to guide the gripping apparatus can be provided for balanced contact with the edge of a wafer. Force monitoring can be provided for the purpose of detecting collisions with object or humans during transport of a wafer.

10 Claims, 4 Drawing Sheets

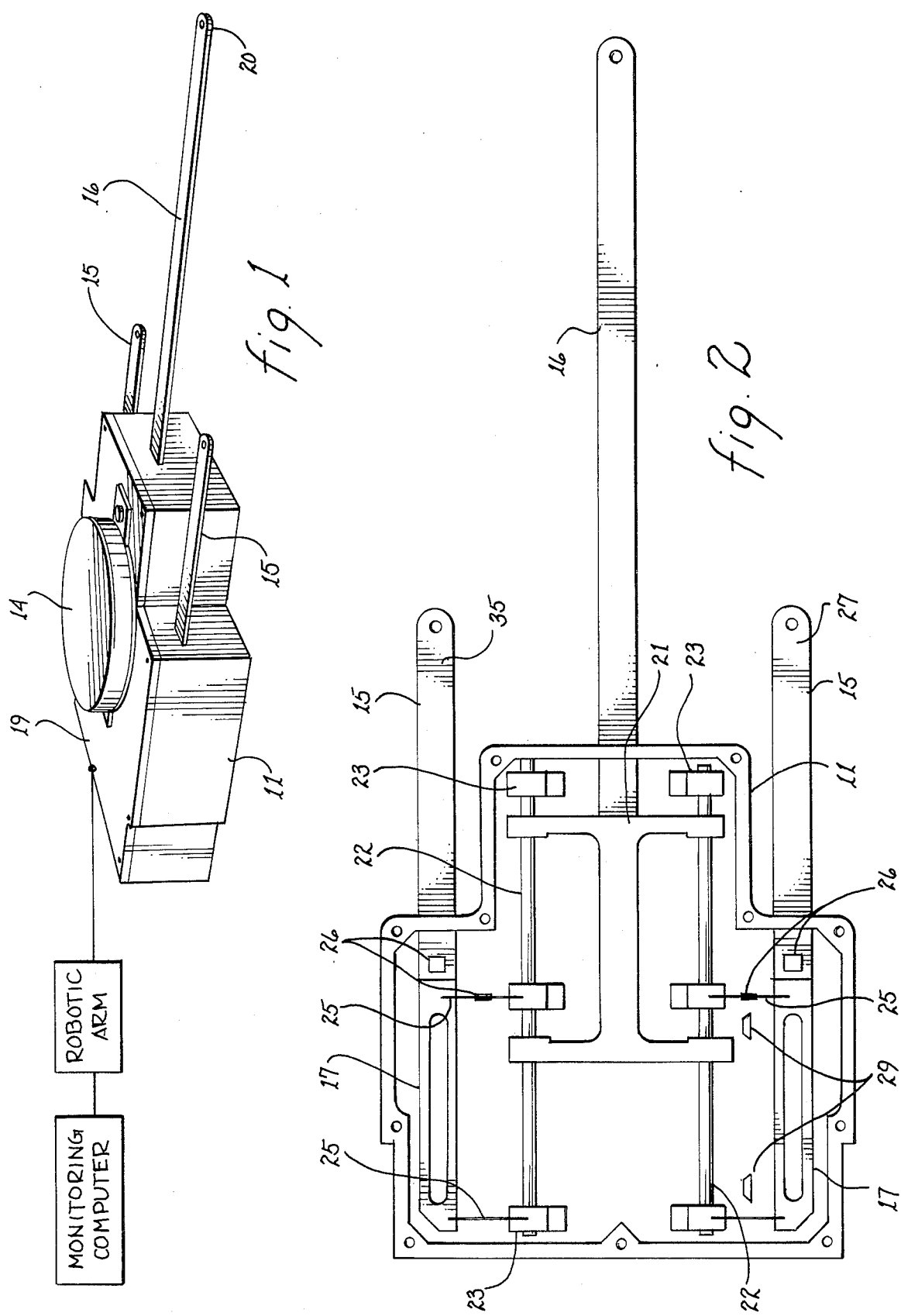

APPARATUS AND METHOD FOR AUTOMATED WAFER HANDLING

This is a continuation of co-pending application Ser. No. 709,518 filed on Mar. 7, 1985 now abandoned.

BACKGROUND OF THE INVENTION

1. Field of the Invention

This invention relates generally to semiconductor wafer handling apparatus and, more particularly, to wafer handling apparatus that can be used in an automated environment. The disclosed apparatus can be used with a robotic arm so that semiconductor wafers can be manipulated without human intervention.

2. Discussion of the Related Art

During the processing of semiconductor substrates or wafers, a multiplicity of routine operations involving large numbers of semiconductor wafer units are involved. For example, unprocessed wafers must be transferred from storage containers known as cassettes to process carriers known as susceptors or boats. Once processed, the wafers must be returned to the storage cassette. These operations have typically been performed by human manipulation in the past. The use of human operators has proven to be less than satisfactory. Particles, such as dandruff and skin, dissipated by humans while manipulating the wafers have caused increasing fabrication problems as the dimensions of integrated circuits become smaller. Breakage can be relatively high due to inefficient handling and the multiplicity of routine operations generates human fatigue with corresponding deterioration of job execution.

In the last few years, a number of robotic arms have been developed and are now commercially available. The robotic arm can execute a multiplicity of gross controllable motions with no decrease in efficiency as a function of repetition rate.

A need has therefore been felt for an apparatus that can be coupled to a robotic arm, is capable of engaging semiconductor wafers and can provide manipulation reliability in excess of the abilities of human operators.

SUMMARY OF THE INVENTION

It is therefore an object of the present invention to provide an improved apparatus and method for handling of semiconductor wafers.

It is a further object of the present invention to provide an improved apparatus for the handling of semiconductor wafers that does not realize the intervention or assistance of a human operator.

It is yet another object of the present invention to provide a method and apparatus for engaging and releasing semiconductor wafers under controlled conditions while information relating to forces being applied to the semiconductor wafer is being monitored.

The aforementioned and other objects are accomplished, according to the present invention, by apparatus having three fingerlike beams or projections, hereinafter referred to as fingers, which project from a housing or apparatus body. The outermost two of the three generally coplanar fingers, are coupled directly to the housing by deformable leaf-type springs. The centermost finger is coupled to a motor driven carriage assembly also by deformable leaf-type springs. The carriage assembly is coupled to the housing. The fingers have small button shaped tips attached to them which can be used to engage a semiconductor wafer. Engaging a wafer is accomplished by extending the center finger, moving the apparatus around the wafer to be picked up, and retracting the centermost finger till the button shaped finger tips engage the wafer. Sensors, in the form of strain gauges, can be coupled to the fingers and the deformable leaf springs. They permit a computer system to monitor the forces exerted on a wafer by the apparatus and also permit monitoring of forces exerted on the fingers by other objects such as the process carrier or cassette in which the wafers can be located. Furthermore, the sensors can permit the detection of unexpected forces on the fingers such as those caused by a collision with an object or person.

These and other features of the present invention will be understood upon reading of the following description along with the accompanying drawings.

BRIEF DESCRIPTION OF THE DRAWINGS

FIG. 1 is a perspective view of the apparatus that can be coupled to a robotic arm according to the instant invention.

FIG. 2 is a top view of the apparatus of the instant invention indicating the position of its internal components when the upper chamber cover has been removed.

OPERATION OF THE PREFERRED EMBODIMENT

DETAILED DESCRIPTION OF THE FIGURES

Figure 3:
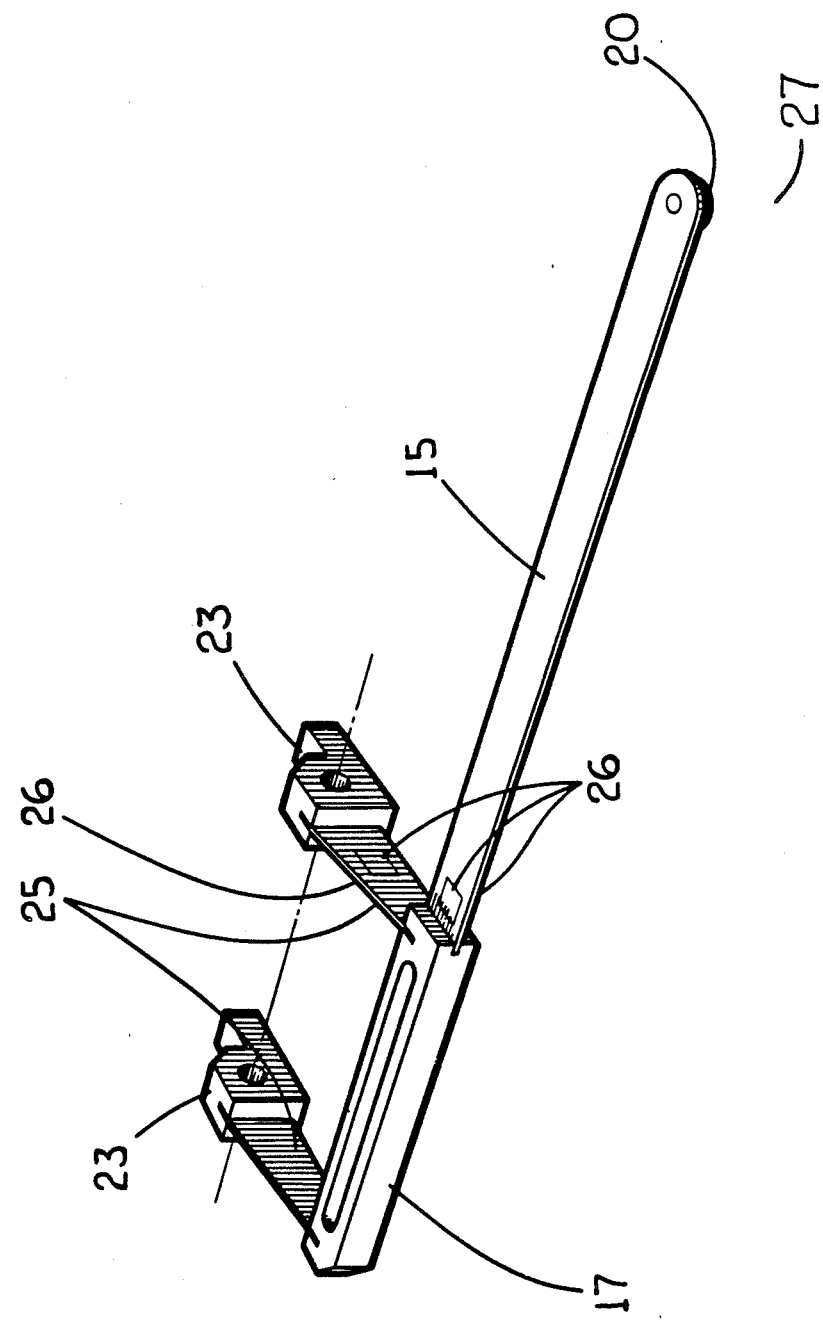
FIG. 3 is a perspective view of a fixed finger subassembly.

Referring now to FIG. 1, the apparatus 10 capable of being coupled to a robotic arm is shown. The body of the apparatus is a two chambered housing 11 and chambers hold the mechanical and electrical components of the apparatus. The upper chamber of the housing 11, as shown in FIG. 2, houses the movable carriage subassembly 21, the subassemblies for the non-movable outermost fingers 35 and 27, and the subassembly for the movable center finger 16.

Referring now to FIG. 3, each of the outermost non-movable finger subassemblies is comprised of a thin stainless steel beam 15 which extends from the housing 11, a thickened stainless steel beam 17 to which the thin beam 15 is attached, two deformable leaf springs 25 which are coupled to the thickened beam section 17, and two rod supports 23 which are used to mount the side finger subassembly to the housing 11. The deformable leaf springs 25 permit the finger to move slightly along its longitudinal axis while holding the finger fixed in all other axes. One of the leaf springs 25 on each finger subassembly is instrumented with a pair of strain gauge sensors 26 to permit monitoring of any deflection of the leaf spring 25. The strain gauge sensors can be any of the commercially available semiconductors or foil type strain gauges. The finger 15 itself is also instrumented with a pair of strain gauges 26 which permit monitoring of any defection or bending of the finger in the direction normal to the plane of the fingers.

Figure 4:
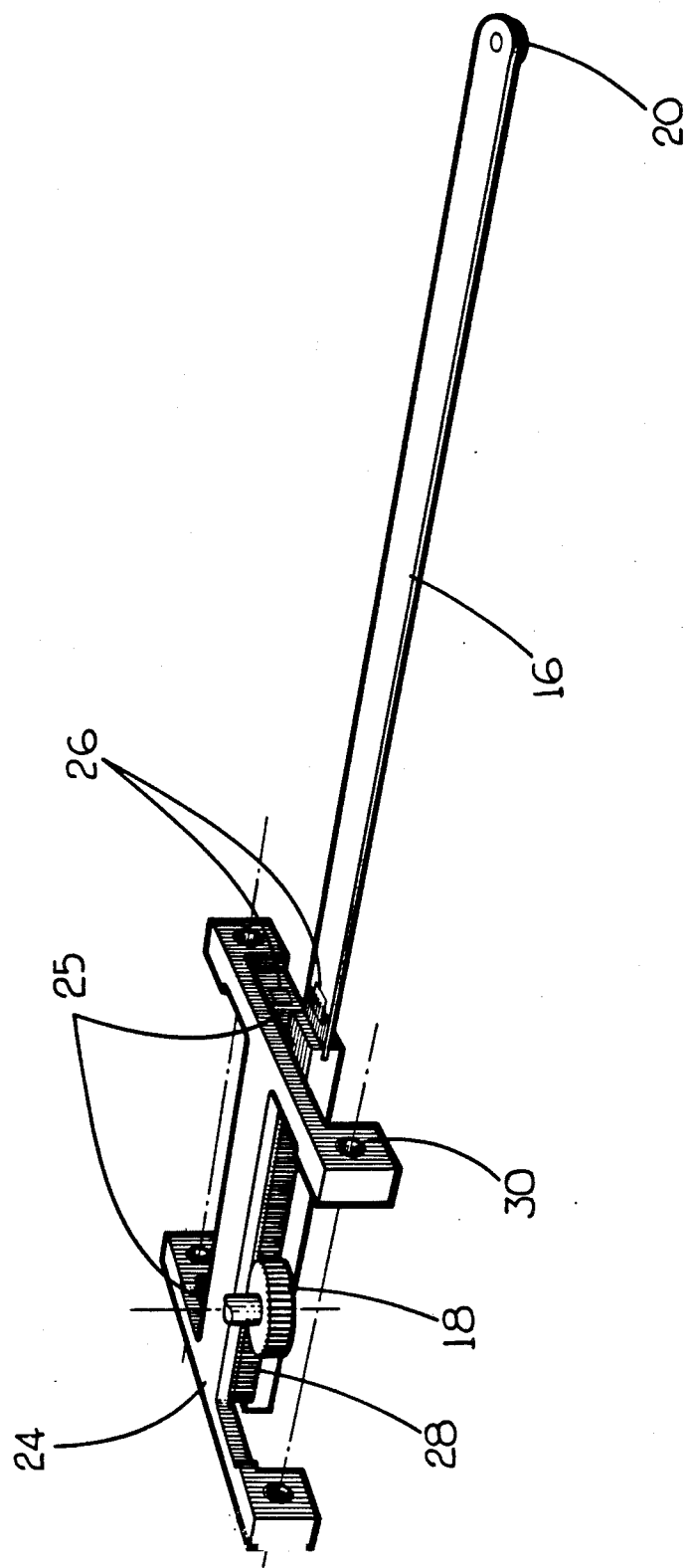
FIG. 4 is a perspective view of a movable carriage subassembly.

Referring to FIG. 2, the rod supports 23 when mounted in the upper cavity of the housing also provide support for two cylindrical rails 22 which carry the movable carriage subassembly 21. Referring now to FIG. 4, the carriage subassembly 21 is comprised of a carriage body 24, rail bearings 30, and a rack gear 28. These are best visualized by reference to FIG. 4. The extendable center finger is attached to the carriage body 24 by two deformable leaf springs 25. Strain gauges 26 are mounted on these leaf springs as well. When assembled, the rack gear 28 is engaged to a pinion gear 18 located on the motor 14 output shaft. This motor is used to drive the center finger in and out of the housing 11. The motor 14 is mounted to the housings upper cavity cover 19 and engages the rack gear 28 when the cover 19 is installed on the housing 11. Rotating the motor drives the carrier and center finger in a linear fashion. Two photo optical sensors 29 are employed to sense an edge of the carriage subassembly 21 for the purpose of determining the fully extended and fully retracted positions of the carriage.

Figure 5:
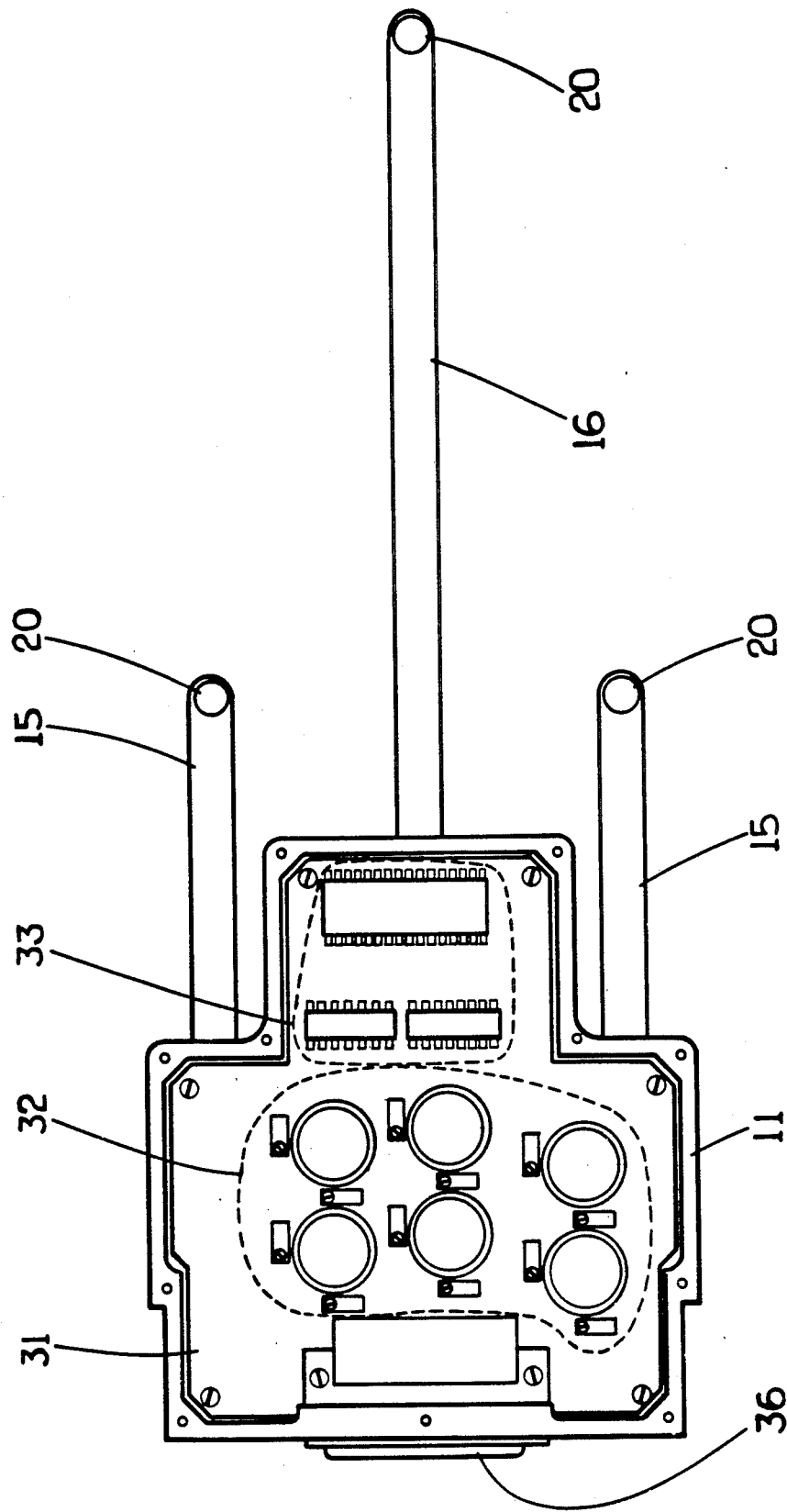
FIG. 5 is a bottom view of the apparatus of the instant invention indicating the position of its internal electrical components when the lower chamber cover has been removed.

Referring to FIG. 5, the lower chamber of the housing 11 contains the electrical components of the apparatus. These components include a printed circuit card 31 on which the other components are mounted, six strain gauge amplifier circuits 32, a motor control circuit 33, and a cable connector. Each of the strain gauge pairs instrumenting the mechanism in the upper chamber is coupled by wires to an amplifier circuit 32. The amplifier circuits 32 amplify and condition the signal received from the strain gauge sensors properly for transmission to a monitoring computer system. The monitoring computer system can be a general purpose data processing unit with appropriate interface units and programming to respond to input signals. The motor control circuit 33 is comprised of three integrated circuits which function to drive the motor a distance specified by a sensor monitoring computer system. The cable connector 36 provides coupling of all electrical signals between the apparatus and a monitoring computer system.

OPERATION OF THE PREFERRED EMBODIMENT

The operation of the preferred embodiment can be understood in the following manner. Five modes of operation are available in which the described invention can be used to transfer a semiconductor wafer between a storage container such as a cassette to a process carrier such as a susceptor. They are (1) Wafer Grasping, (2) Wafer Releasing, (3) Wafer Edge Location, (4) Surface Location, and (5) Collision Detection. In each of these modes of operation the data from the strain gauge sensors is utilized to increase the functional reliability of the wafer transfer operation. The signals from the strain gauges are processed in the electronic components contained with the apparatus 10 and transferred to the data processing control apparatus (not shown) associated with the robotic arm. The gross position of the plurality of wafers to be handled by the apparatus can be programmed into the robotic arm. The robotic arm then moves the holding apparatus 10 into position above the wafer in the storage cassette. The center finger is then extended under control of the computer program. The button shaped tips 20 located on the ends of each of the fingers are now positioned relatively close to the surface but outside the edge of the wafer. The robot arm lowers the apparatus 10 into a position wherein the button shaped finger tips 20 lie roughly in the plane of the wafer. A controlled motion of the robot arm is then commanded and directed by the sensor monitoring computer system which moves the apparatus 10 until the outer side fingers contact the edge of the wafer with a predetermined force. Any imbalance in forces detected due to initial midpositioning of the apparatus is detected and the robot arm directed to shift the position of the apparatus 10 accordingly. This mode of operation is referred to as Wafer Edge Location operation.

The extendable finger is then retracted, eventually engaging the wafers edge. The wafer is subsequently pushed against the outer fixed fingers, deflecting their deformable leaf springs 25. When the deformation of the leaf springs reaches a predetermined level, as monitored by the strain gauges, the motor driving the center finger is stopped. The wafer is now safely grasped. This mode of operation is Wafer Grasping.

The robotic arm is used to move wafer handling apparatus 10 and the wafer into a gross position relative to the surface of the process carrier being loaded. For example, should the process carriers be vertical, as is the case with some types of susceptors, the position of the apparatus would now be roughly parallel to the surface of the carrier, but at some distance away. The Surface Locating mode can now be used to coordinate the motion of the robot arm necessary to align the wafer very closely to, or even directly on the susceptor's surface. The strain gauge sensors on the fingers provide the data necessary to carry out this task. Once all fingers are deflected the same distance by the surface, the robot arm motion can be halted.

Under program control, the robotic arm can move the wafer handling apparatus 10 a predetermined distance from the surface to avoid partial generation by scratching the wafer along the surface, and Wafer Edge Location mode of operation can be employed to seek whatever registration guides are projecting from the susceptors surface on which the wafer will be carried. In this mode of operation, the apparatus and wafer are moved along the surface until the registration guides are contacted.

Once the wafer is secure against the carriers registration guides and resting on the carriers surface, the Wafer Releasing Mode of operation can be used. In this mode of operation, the center finger is extended while the monitoring computer monitors the force remaining on the outer fixed fingers leaf springs 25. Since the wafer is at this time constrained between the fixed fingers of the apparatus and the carriers registration guides, no significant change in deflection of these leaf springs should occur as the center finger is extended. In effect the apparatus will not be allowed to release to wafer to a nonsecure position.

The wafer can be released and the robotic arm can be used to move the apparatus away from the process carrier and commence its next loading cycle. This operation can of course be reversed for the unloading of the process carrier. The strain gauge sensors on all fingers also permit the sensing of unexpected contact with objects or humans. When such contact is detected an appropriate response can be commanded to the robotic arm. For example, the robotic arm can be halted immediately or commanded to move at a slower rate until it is determined that the obstruction no longer exists.

The above description is included to illustrate the operation of the preferred embodiment and is not meant to limit the scope of the invention. The scope of the invention is to be limited only by the following claims. From the above description, many variations will be apparent to one skilled in the art that would yet be encompassed by the spirit and scope of the invention.

What is claimed is:

1. A semiconductor wafer gripping apparatus for use with a robotic arm and a monitoring computer for controlling the robotic arm and semiconductor wafer gripping apparatus, comprising:

an extendable finger member having gripping means attached to the extensible end of said extendable finger member for engaging the outer peripheral edge of a semiconductor wafer;

at least one nonextendable arm disposed substantially co-planar to said extendable finger member, each of said at least one nonextendable arm having gripping means for engaging the outer peripheral edge of a semiconductor wafer attached to the end of said nonextendable arm, said gripping means of said extendible finger member and said gripping means of said at least one nonextendable arm being substantially co-planar;

a housing, said extendable finger member being operably mounted in and substantially co-planar with said housing and extensible therefrom;

at least one deformable spring, said at least one deformable spring coupling said at least one nonextendable arm to said housing; and at least one strain gauge coupled to each of said at least one deformable spring, said strain gauge being coupled electrically to the monitoring computer used to control the extensible movement of said extendable finger member and directing the motions of the robotic arm.

2. The gripping apparatus of claim 1 further comprising at least one strain gauge coupled to said extendable member, said strain gauge providing an output signal when force is exerted on said finger member.

3. A gripping apparatus for engaging a generally circular planar material comprising:

at least three gripping means, said at least three gripping means further comprising at least one extensible member and at least one fixed member disposed substantially co-planar therewith;

structure means coupled to each of said gripping means for controlling contact with said material, said structure means being substantially co-planar for grasping a generally circular planar material;

means for controlling motion of said gripping means to accommodate substantially planar materials of varying diameters;

sensor means coupled to at least one of said at least three gripping means for controlling movement of at least one of said at least three gripping means in response to a force exerted on said generally circular planar material; and deformable spring means for coupling said at least one fixed member to said sensor means.

4. The gripping apparatus of claim 3 further including second sensor means coupled to at least one of said gripping means for detecting a force having a component perpendicular to a plane formed by said at least three gripping means.

5. Apparatus for use with a robotic arm for handling semiconductor wafer workpieces comprising:

a housing structure;

at least three members extending from said housing structure at least one of said at least three members being extensibly and operably secured in said housing and capable of co-planar movement therewith;

coupling means for coupling each of said at least three members to said housing structure, said coupling means including deformable spring means coupled to each of said at least three members and sensing means, coupled to said deformable spring means, for determining a force exerted on at least one of said at least three members; and extension means for imparting extensible and co-planar movement to said at least one of said at least three members being extensibly and operably secured in said housing relative to said apparatus.

6. The apparatus of claim 5 when said apparatus has a predetermined position relative to a workpiece, said extension means causing said members to engage said workpiece.

7. The apparatus of claim 5 wherein said said sensing means includes a strain gauge coupled to said deformable spring means.

8. The apparatus of claim 7 further including control apparatus, said control apparatus stopping operation of said extension means when parameters of said strain gauge predetermined values.

9. The apparatus of claim 8 further including at least a second strain gauge coupled to said other member, parameters of said second strain gauge indicating when contact is made with a body.

10. The apparatus of claim 9 wherein a workpiece can be positioned, and placed in a predetermined position relative to a workpiece carrier in response to said second strain gauge parameters.

* * * * *